(12) United States Patent
Lim

(10) Patent No.: US 11,468,936 B2
(45) Date of Patent: Oct. 11, 2022

(54) SEMICONDUCTOR MEMORY DEVICE CAPABLE OF PERFORMING TARGET REFRESH OPERATION ON ACTIVE COMMAND BASIS AND REFRESH COMMAND BASIS, AND OPERATING METHOD THEREOF

(71) Applicant: SK hynix Inc., Gyeonggi-do (KR)

(72) Inventor: Jung Ho Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/095,494

(22) Filed: Nov. 11, 2020

(65) Prior Publication Data

US 2021/0407570 A1    Dec. 30, 2021

(30) Foreign Application Priority Data

Jun. 24, 2020  (KR) .................... 10-2020-0077071

(51) Int. Cl.
| | |
|---|---|
| *G11C 11/406* | (2006.01) |
| *G11C 11/4091* | (2006.01) |
| *G11C 11/408* | (2006.01) |
| *G11C 11/4076* | (2006.01) |

(52) U.S. Cl.
CPC ........ *G11C 11/406* (2013.01); *G11C 11/4076* (2013.01); *G11C 11/4082* (2013.01); *G11C 11/4085* (2013.01); *G11C 11/4091* (2013.01); *G11C 11/40603* (2013.01); *G11C 11/40611* (2013.01)

(58) Field of Classification Search
CPC ......................... G11C 11/406; G11C 11/4091; G11C 11/4085
See application file for complete search history.

(56) References Cited

U.S. PATENT DOCUMENTS

| | | | |
|---|---|---|---|
| 10,388,363 B1* | 8/2019 | Ito ...................... | G11C 11/40615 |
| 10,916,293 B1* | 2/2021 | Lai ..................... | G11C 11/40618 |
| 11,094,369 B1* | 8/2021 | Joo ........................ | G11C 7/106 |
| 2014/0119091 A1* | 5/2014 | You ....................... | G11C 11/402 |
| | | | 365/72 |
| 2015/0162066 A1* | 6/2015 | Song ..................... | G11C 11/408 |
| | | | 365/222 |

(Continued)

FOREIGN PATENT DOCUMENTS

| | | |
|---|---|---|
| KR | 10-2015-0002128 | 1/2015 |
| KR | 10-2017-0112038 | 10/2017 |

*Primary Examiner* — Mushfique Siddique
(74) *Attorney, Agent, or Firm* — IP & T Group LLP

(57) ABSTRACT

A semiconductor memory device includes a plurality of memory blocks including a plurality of word lines; a plurality of sense amplifying circuits, each being shared by adjacent memory blocks among the memory blocks; a refresh counter suitable for generating a counting address, a value of which increases according to a refresh command; an address storing circuit suitable for storing first and second target addresses by sampling an active address at different times; and a control circuit suitable for activating a word line corresponding to one of the counting address and the first target address according to the refresh command, and activating at least one word line corresponding to one or more of the active address and the second target address according to an active command.

25 Claims, 6 Drawing Sheets

(56) References Cited

U.S. PATENT DOCUMENTS

| | | | |
|---|---|---|---|
| 2015/0162071 A1* | 6/2015 | Yoon | G11C 11/406 |
| | | | 365/203 |
| 2016/0351248 A1* | 12/2016 | Jung | G11C 11/4087 |
| 2018/0061476 A1* | 3/2018 | Kim | G11C 11/4076 |
| 2018/0182445 A1* | 6/2018 | Lee | G11C 8/06 |
| 2020/0302994 A1* | 9/2020 | Enomoto | G11C 11/40603 |
| 2021/0075408 A1* | 3/2021 | Noguchi | G11C 11/406 |

* cited by examiner

SEMICONDUCTOR MEMORY DEVICE CAPABLE OF PERFORMING TARGET REFRESH OPERATION ON ACTIVE COMMAND BASIS AND REFRESH COMMAND BASIS, AND OPERATING METHOD THEREOF

CROSS-REFERENCE TO RELATED APPLICATION

The present application claims priority under 35 U.S.C. § 119 on Korean Patent Application No. 10-2020-0077071, filed on Jun. 24, 2020, which is incorporated herein by reference in its entirety.

BACKGROUND

1. Field

Various embodiments described herein relate to a semiconductor design technology and, more particularly, a semiconductor memory device for performing a refresh operation and an operating method thereof.

2. Description of the Related Art

Semiconductor memory devices include a plurality of memory cells. Each memory cell may include a transistor serving as a switch and a capacitor storing charge (i.e., data). The data may have one of two logic levels, namely a high logic level (e.g., Logic 1) or a low logic level (Logic 0). The logic level of the data may depend on whether or not charge is stored in the capacitor, that is, whether the terminal voltage of the capacitor is high or low.

Since data are stored in the form of charge accumulated in the capacitor, theoretically storing data should not consume power. However, due to current leakage caused by a PN coupling of the transistor, an initial amount of charge stored in the capacitor of each memory cell may not be stably maintained. As a result, data stored in the memory cell may be lost. In an attempt to prevent losing data, data in the memory cell may be read before the data is lost and the capacitor may be recharged to ensure that a sufficient amount of charge is stored. This operation may be performed repeatedly at set periods to retain accurate data. (The process of recharging a memory cell may be referred to as a refresh operation, e.g., a 'normal refresh operation').

In addition to performing normal refresh operations, 'target refresh operations' may be performed on memory cells of word lines that are likely to lose data due to a row hammering phenomenon. Row hammering refers to a phenomenon in which data of memory cells coupled to the same word line, or word lines adjacent to a particular word line, are damaged or distorted due to high activation frequency of that word line. In order to prevent row hammering, target refresh operations may be performed on a word line which is frequently activated (e.g., a set number of times) or on adjacent word lines.

During a normal refresh operation in which the word lines are refreshed periodically in refresh cycles, the target refresh operation is being carried out additionally. In other words, during the refresh cycle, the normal refresh operation for sequentially refreshing the word lines, and the target refresh operation for refreshing only certain word lines among the word lines, are performed together. Thus, the current target refresh operation may be performed on a refresh command basis. However, there is a limit to allocate the normal and target refresh operations within a single refresh cycle as memory device size becomes smaller, which causes deterioration of the refresh retention time, as well as durability against row hammering.

SUMMARY

Various embodiments are directed to a semiconductor memory device capable of performing a target refresh operation on an active refresh command basis, as well as performing the target refresh operation on a refresh command basis, and an operating method thereof.

In accordance with an embodiment, a semiconductor memory device includes: a plurality of memory blocks including a plurality of word lines; a plurality of sense amplifying circuits, each being shared by adjacent memory blocks among the memory blocks; a refresh counter suitable for generating a counting address, a value of which increases according to a refresh command; an address storing circuit suitable for storing first and second target addresses by sampling an active address at different times; and a control circuit suitable for activating a word line corresponding to one of the counting address and the first target address according to the refresh command, and activating at least one word line corresponding to one or more of the active address and the second target address according to an active command.

In accordance with an embodiment, a semiconductor memory device includes: a cell array region in which a plurality of word lines are disposed; a first sampling latch suitable for storing an active address as a first target address according to a first sampling signal; a second sampling latch suitable for storing the active address as a second target address according to a second sampling signal; a refresh control circuit suitable for selecting the first target address when the number of inputs of refresh commands reaches a first threshold and selecting the second target address according to a result of comparing the active address with the second target address when the number of inputs of active commands is greater than or equal to a second threshold, the refresh control circuit being suitable for providing the selected address as a refresh address; and a row control circuit suitable for activating a word line corresponding to the active address in response to the active command, and activating a word line corresponding to the refresh address in response to the refresh command or the active command.

In accordance with an embodiment, an operating method of a semiconductor memory device including a plurality of memory blocks including a plurality of word lines, and a plurality of sense amplifying circuits, each being shared by adjacent memory blocks among the memory blocks, includes: storing an active address as a first target address according to a first sampling signal; storing the active address as a second target address according to a second sampling signal; selecting the first target address when the number of inputs of refresh commands reaches a first threshold and selecting the second target address according to a result of comparing the active address with the second target address when the number of inputs of active commands is greater than or equal to a second threshold, and providing the selected address as a refresh address; and activating a word line corresponding to the active address in response to the active command, and activating a word line corresponding to the refresh address in response to the refresh command.

In accordance with an embodiment, a semiconductor memory device includes: first and second memory blocks sharing a sense amplifying circuit; an address storing circuit suitable for storing, as a target address, a sampled address indicating a word line within the first memory block, among provided active addresses; and a control circuit suitable for activating, when the number of inputs of active commands reaches a threshold, the word line depending on whether a currently provided active address indicates the second memory block.

These and other features and advantages of the embodiments disclosed herein will be better understood by those with ordinary skill in the field relating to the following detailed description in conjunction with the accompanying drawings.

DETAILED DESCRIPTION

Figure 1:
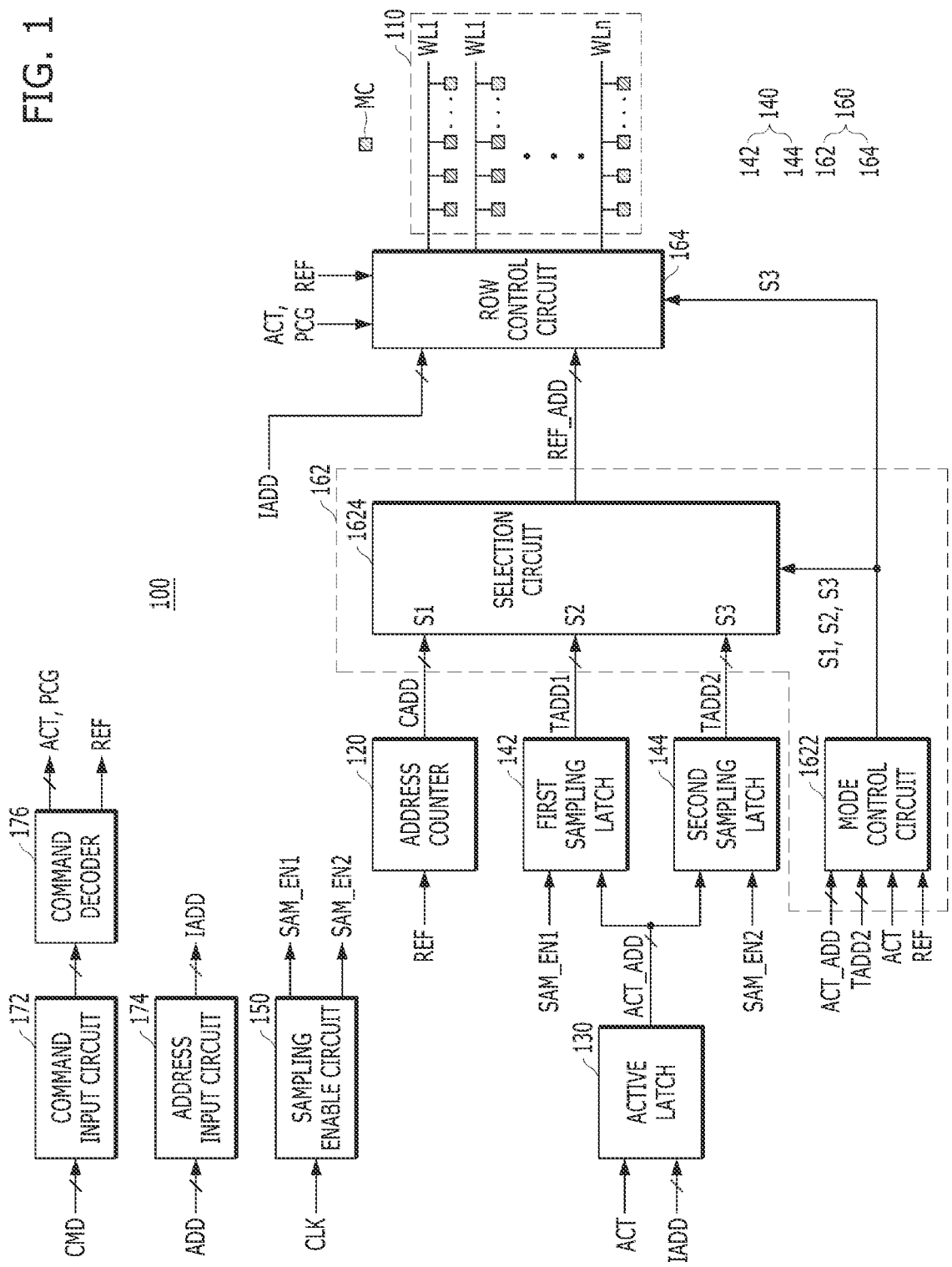
FIG. 1 is a block diagram illustrating a semiconductor memory device in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, various embodiments of the present invention are described in detail with reference to the attached drawings.

In one or more embodiments, an operation to sequentially refresh a plurality of word lines of a memory device may be defined as a normal refresh operation, and an operation to refresh one or more word lines adjacent to a word line with relatively high activation frequency (high active word line) may be defined as a target refresh operation.

Figure 2A:
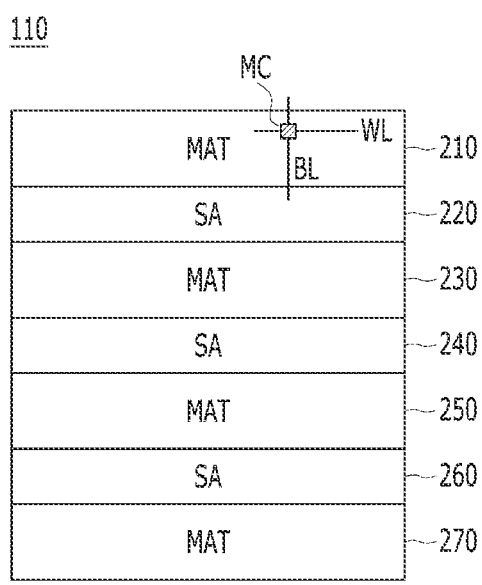
FIGS. 2A and 2B are diagrams illustrating a cell array region of a semiconductor memory device, such as that of FIG. 1.
Figure 2B:
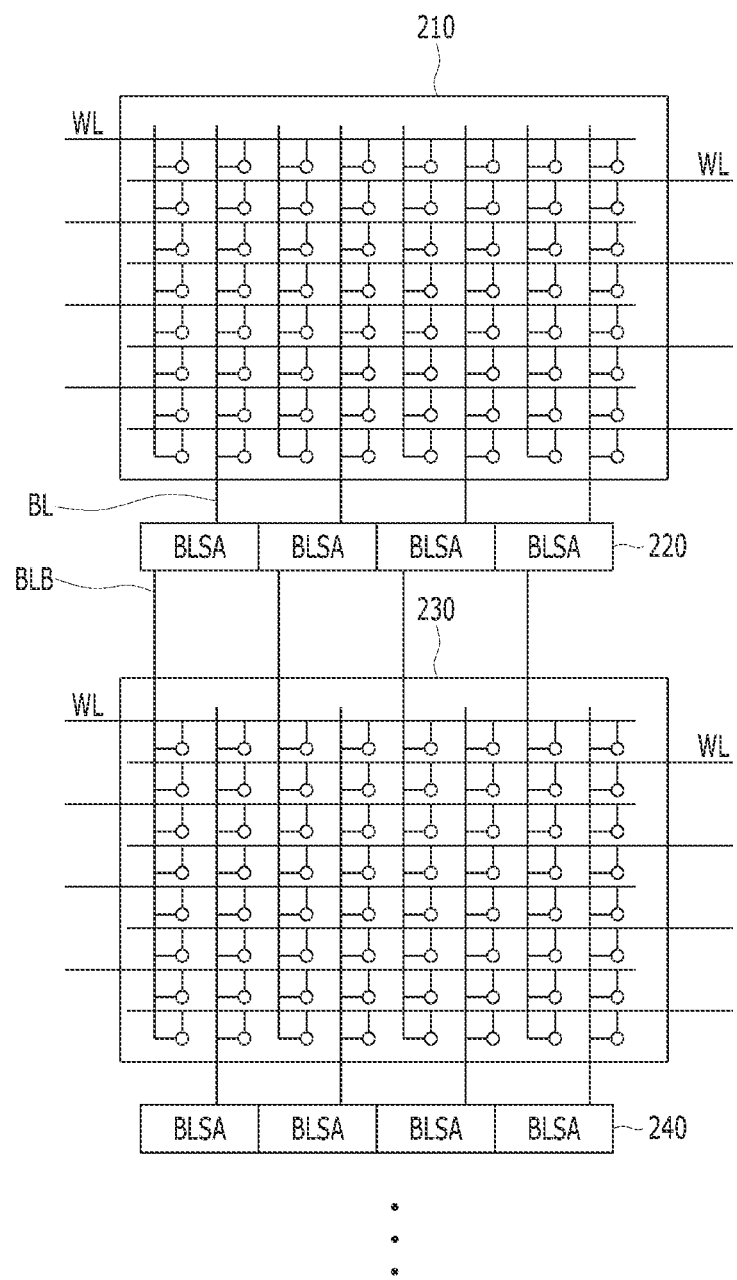

FIG. 1 is a block diagram illustrating a semiconductor memory device 100 in accordance with an embodiment of the present invention. FIGS. 2A and 2B are diagrams illustrating a cell array region 110 of FIG. 1.

Referring to FIG. 1, the semiconductor memory device 100 may include a cell array region 110, a refresh counter 120, an active latch 130, an address storing circuit 140, a sampling enable circuit 150, a control circuit 160, a command input circuit 172, an address input circuit 174, and a command decoder 176. The control circuit 160 may include a refresh control circuit 162 and a row control circuit 164.

The command input circuit 172 may receive a command CMD, and the address input circuit 174 may receive an address ADD. The address input circuit 174 may receive the address ADD and output an internal input address IADD. Each of the command CMD and the address ADD may include a multi-bit signal. The command decoder 176 may decode the command CMD inputted through the command input circuit 172, and generate an active command ACT, a precharge command PCG, and a refresh command REF. The command decoder 176 may generate a read command and a write command, as well as other commands, by decoding the command CMD.

The cell array region 110 may include a plurality of memory cells MC disposed at intersections of a plurality of word lines WL1 to WLn extending in a first direction and a plurality of bit lines extending in a second direction perpendicular to the first direction (not shown). The memory cells MC may be coupled to the word lines WL1 to WLn through the row control circuit 164, and to the bit lines through a sense amplifying circuit (not shown).

Referring to FIG. 2A, the cell array region 110 having one bank is shown. The cell array region 110 may include a plurality of memory blocks (MAT) 210, 230, 250, and 270, and a plurality of sense amplifying circuits (SA) 220, 240, and 260. In each of the memory blocks 210, 230, 250, and 270, the memory cells MC may be disposed at intersections of the word lines WL and the bit lines BL as described above. One memory cell MC may be formed of a capacitor and a transistor, which are coupled between a corresponding word line WL and a corresponding bit line BL. Each of the memory blocks 210, 230, 250, and 270 may be defined as a unit in which the memory cells MC for storing data are arranged in the form of a matrix. The sense amplifying circuits 220, 240, and 260 may be coupled to the memory cells MC through the bit lines BL, and sense and amplify the data of the memory cells MC transferred through the bit lines BL. Each of the sense amplifying circuits 220, 240, and 260 may be shared by adjacent memory blocks. For example, sense amplifying circuit 220 is shared by memory blocks 210 and 230, sense amplifying circuit 240 is shared by memory blocks 230 and 250, and sense amplifying circuit 260 is shared by memory blocks 250 and 270.

Referring to FIG. 2B, the cell array region 110 having an open bit-line structure is shown. In the open bit-line structure, a main bit line BL and a reference bit line BLB are disposed in different memory blocks 210, 230, 250, and 270, based on the sense amplifying circuits 220, 240, and 260. For example, the sense amplifying circuit 220 senses and amplifies a voltage difference between the main bit line BL of the memory block 210 and the reference bit line BLB of the memory block 230. That is, the sense amplifying circuit 220, which is shared by adjacent memory blocks 210 and 230, senses and amplifies the data transferred through the bit lines BL and BLB from the memory blocks 210 and 230. Each of the other sense amplifying circuits 240 and 260 operate in same way with respect the corresponding adjacent memory blocks. Each of the sense amplifying circuits 220, 240, and 260 may include a plurality of sense amplifiers BLSA corresponding to the respective bit lines BL and BLB.

To read out the data of a certain word line WL within the memory block 210, a word line driving signal for activating the certain word line WL of the memory block 210 may be inputted. Accordingly, data having a set value (e.g., "1") may be outputted through the main bit line BL from the memory block 210, and data having a reference value "O" may be outputted through the reference bit line BLB from the memory block 230. The sense amplifier BLSA of the sense amplifying circuit 220 may sense and amplify a voltage difference of the main bit line BL and the reference bit line BLB to output the amplified data to a data input/output (I/O) circuit (not shown). Hereafter, features of embodiments of the present invention are described to the context of a semiconductor memory device employing the open bit-line structure. However, the present invention is not limited to open bit line structure semiconductor devices. Those skilled in the art to which the present invention pertains will understand from the present disclosure that the present invention may be equally applied to a semiconductor memory device having a folded bit-line structure.

Referring back to FIG. 1, the refresh counter 120 may generate a counting address CADD according to the refresh command REF. The refresh counter 120 may generate the counting address CADD, a value of which changes based on refreshing any of the word lines WL1 to WLn. For example, the refresh counter 120 may increase a value of the counting address CADD by +1 whenever the refresh command REF is inputted. The counting address CADD may be used to designate word lines to be activated and refreshed during a normal refresh operation. The refresh counter 120 may change the value of the counting address CADD such that a (K+1)th word line WLK+1 is currently selected when a K-th word line WLK was previously selected.

The active latch 130 may store the input address IADD inputted together with the active command ACT, as an active address ACT_ADD. The active latch 130 may be implemented with a latch circuit for providing the active address ACT_ADD by storing the input address IADD according to the active command ACT. Preferably, the active latch 130 may be composed of a plurality of flip-flops corresponding to bits of the active address ACT_ADD. For example, the flip-flops may latch the input address IADD to output the active address ACT_ADD when the active command ACT is inputted.

The address storing circuit 140 may store a first target address TADD1 and a second target address TADD2 by randomly sampling the active address ACT_ADD at different times. For example, the active address ACT_ADD sampled at one time may be TADD1 and the active address ACT_ADD sampled at different time may be TADD2. The address storing circuit 140 may include a first sampling latch 142 and a second sampling latch 144.

The first sampling latch 142 may store the active address ACT_ADD as the first target address TADD1 according to a first sampling signal SAM_EN1 that is enabled at a random point. That is, the first sampling latch 142 may generate the first target address TADD1 by sampling the active address ACT_ADD inputted together with the active command ACT, at the random point. The second sampling latch 144 may store the active address ACT_ADD as the second target address TADD2 according to a second sampling signal SAM_EN2 that is enabled at a random point. That is, the second sampling latch 144 may generate the second target address TADD2 by sampling the active address ACT_ADD inputted together with the active command ACT, at the random point. Preferably, each of the first and second sampling latches 142 and 144 may be composed of a plurality of flip-flops for outputting the respective target addresses TADD1 and TADD2 by latching the active address ACT_ADD when the respective sampling signals SAM_EN1 and SAM_EN2 are enabled. The first and second target addresses TADD1 and TADD2 may be used to designate word lines to be activated and refreshed during a target refresh operation. The first and second target addresses TADD1 and TADD2 may indicate, for example, one or more word lines adjacent to a high active word line.

The sampling enable circuit 150 may generate the first and second sampling signals SAM_EN1 and SAM_EN2 that are randomly enabled at different times. For example, the sampling enable circuit 150 may generate an oscillating signal using an oscillator (not shown), and generate the first sampling signal SAM_EN1 that is enabled at a rising edge of the oscillating signal, and generate the second sampling signal SAM_EN2 that is enabled at a falling edge of the oscillating signal.

For reference, the input address IADD inputted together with the active command ACT, may indicate an active word line to be activated in response to the active command ACT. If an address of an active word line is stored at a random point, a target refresh operation may be performed on the active word line corresponding to the stored address and/or one or more word lines adjacent to the active word line. Thus, in an embodiment, it may not be necessary to count the total number of activated word lines in order to perform a target refresh operation. Implementing this approach, which does not use (e.g., omits) counters to count the number of all activated word lines, allows the size of the memory device to be substantially reduced or minimized. At the same time, this approach prevents word line disturbance that may otherwise occur, with at least a certain probability, due to the row hammering phenomenon. While embodiments in which sampling at one or more random points are performed has been discussed, sampling may be performed at one or more set points and/or with a set frequency in other embodiments.

The control circuit 160 may activate a word line corresponding to the counting address CADD or the first target address TADD1 according to the refresh command REF.

Further, the control circuit 160 may activate at least one word line corresponding to the active address ACT_ADD and/or the second target address TADD2 according to the active command ACT. The control circuit 160 may activate a word line corresponding to the counting address CADD when the number of inputs of the refresh commands REF is less than a first threshold, and activate a word line corresponding to the first target address TADD1 whenever the number of inputs of the refresh commands REF reaches the first threshold. The control circuit 160 may activate at least one word line corresponding to the active address ACT_ADD and/or the second target address TADD2 by determining whether or not memory blocks, respectively corresponding to the active address ACT_ADD and the second target address TADD2, share a sense amplifying circuit when the number of inputs of the active commands ACT is greater than or equal to a second threshold.

In detail, the refresh control circuit 162 may provide the counting address CADD as a refresh address REF_ADD while the number of inputs of the refresh commands REF is less than the first threshold. The refresh control circuit 162 may provide the first target address TADD1 as the refresh address REF_ADD when the number of inputs of the refresh commands REF reaches the first threshold.

For example, assuming that 8K word lines are disposed in a bank, after 8192 refresh commands REF are inputted for the normal refresh operation, an additional refresh command REF is inputted for the target refresh operation.

In an embodiment, the refresh control circuit 162 may provide the counting address CADD as the refresh address REF_ADD while the number of inputs of the refresh commands REF is less than 8193 (i.e., the first threshold), and provide the first target address TADD1 as the refresh address REF_ADD when the number of inputs of the refresh commands REF reaches 8193.

In an embodiment, 8192 refresh commands REF may be grouped into units (e.g., two), each containing the same number of refresh commands, and inputted in those units. Thus, 4096 refresh commands REF are inputted first and then the remaining 4096 refresh commands REF are inputted for the normal refresh operation. In between inputting the two sets of refresh commands REF, an additional refresh command REF is inputted for the target refresh operation, during a refresh cycle. For example, the refresh control circuit 162 may provide the counting address CADD as the refresh address REF_ADD while the number refresh commands REF input is less than 4097 (i.e., the first threshold), provide the first target address TADD1 as the refresh address REF_ADD when the number refresh commands REF input reaches 4097, and provide the counting address CADD as the refresh address REF_ADD as the second unit of refresh commands REF are input.

In this way, the refresh control circuit 162 may provide the refresh address REF_ADD by selecting the counting address CADD while the number of inputs of the refresh commands REF is less than the first threshold, and by selecting the first target address TADD1 whenever the number of inputs of the refresh commands REF reaches the first threshold.

The above description explains that one refresh command REF is inputted for the target refresh operation. However, that is only an example; the invention is not limited to that configuration. In another embodiment, two or more refresh commands REF may be inputted for the target refresh operation.

Further, the refresh control circuit 162 may compare the active address ACT_ADD with the second target address TADD2 when the number of inputs of the active commands ACT inputted is greater than or equal to the second threshold. Depending on a result of the comparison, the refresh control circuit 162 may or may not provide the second target address TADD2 as the refresh address REF_ADD.

In a semiconductor device having, for example, the structure of FIGS. 2A and 2B, the sense amplifying circuits 220, 240, and 260 are shared by the adjacent memory blocks 210, 230, 250, and 270. When refreshing a word line of the memory block 230 in a state that a word line driving signal is enabled to read out data for a certain word line in the memory block 210, there is a risk of errors in the data. Specifically, when the word line driving signal is enabled to read out data for the certain word line in the memory block 210, a data value (for example, "1") of a memory cell corresponding to the certain word line is outputted through the main bit line BL from the memory block 210 to the sense amplifying circuit 220. Since a word line driving signal is also enabled to refresh the word line of the memory block 230, a data value (for example, "1") of a memory cell corresponding to the word line, which is different from a reference value "0", is outputted through the reference bit line BLB from the memory block 230 to the sense amplifying circuit 220. The sense amplifying circuit 220 may sense and amplify a difference (i.e., "0") between the data value "1" of the main bit line BL and the data value "1" of the reference bit line BLB to output the amplified data to the data I/O circuit. As a result, the data value "1" has been stored in the memory block 210, but there occurs an error that the data "0" is outputted.

To avoid these errors, in an embodiment, the refresh control circuit 162 may determine, by comparing the active address ACT_ADD with the second target address TADD2, whether or not the memory blocks corresponding to the active address ACT_ADD and the second target address TADD2, respectively, share the sense amplifying circuit. When the corresponding memory blocks do not share the sense amplifying circuit, the refresh control circuit 162 may provide the second target address TADD2 as the refresh address REF_ADD. When the corresponding memory blocks share the sense amplifying circuit, the refresh control circuit 162 may not provide the second target address TADD2 as the refresh address REF_ADD.

In detail, the refresh control circuit 162 may include a mode control circuit 1622 and a selection circuit 1624.

The mode control circuit 1622 may respectively count the number of inputs of the refresh commands REF and the number of inputs of the active commands ACT. The mode control circuit 1622 may enable a first selection signal S1 or a second selection signal S2 according to the number of inputs of the refresh commands REF. The mode control circuit 1622 may enable the first selection signal S1 when the number of inputs of the refresh commands REF is less than the first threshold, and enable the second selection signal S2 when the number of inputs of the refresh commands REF reaches the first threshold. The mode control circuit 1622 may reset the counted number of refresh commands REF input when the number of inputs of the refresh commands REF reaches the first threshold. The mode control circuit 1622 may enable the third selection signal S3 according to a result of comparing the active address ACT_ADD with the second target address TADD2, when the number of inputs of the active commands ACT is greater than or equal to the second threshold.

The selection circuit 1624 may output the refresh address REF_ADD by selecting one of the counting address CADD, the first target address TADD1, and the second target address TADD2, according to the first to third selection signals S1 to S3. The selection circuit 1624 may select the counting address CADD when the first selection signal S1 is enabled, select the first target address TADD1 when the second selection signal S2 is enabled, and select the second target address TADD2 when the third selection signal S3 is enabled.

The row control circuit 164 may activate a word line corresponding to the input address IADD in response to activation of the active command ACT, and may precharge the activated word line in response to the precharge command PCG. The row control circuit 164 may activate and refresh a word line corresponding to the refresh address REF_ADD in response to the refresh command REF. In an embodiment, when the third selection signal S3 is enabled, the row control circuit 164 may activate a word line corresponding to the refresh address REF_ADD at a certain interval after activating a word line corresponding to the input address IADD, in response to the active command ACT. Thereafter, the row control circuit 164 may precharge the activated word lines in response to the precharge command PCG.

As described above, in accordance with an embodiment, the semiconductor memory device 100 may perform the target refresh operation using the first target address TADD1 according to the refresh command REF, or using the second target address TADD2 according to the active command ACT. In particular, the semiconductor memory device 100 may perform the target refresh operation, according to the active command ACT, on a memory cell that does not share the sense amplifying circuit with a memory cell on which a normal operation (such as a read or write operation) is performed. Consequently, the semiconductor memory device 100 may perform the additional target refresh operation while performing the normal operation. It is possible to improve target refresh efficiency by performing the target refresh operation on the active command basis as well as performing the target refresh operation on the refresh command basis.

Figure 3:
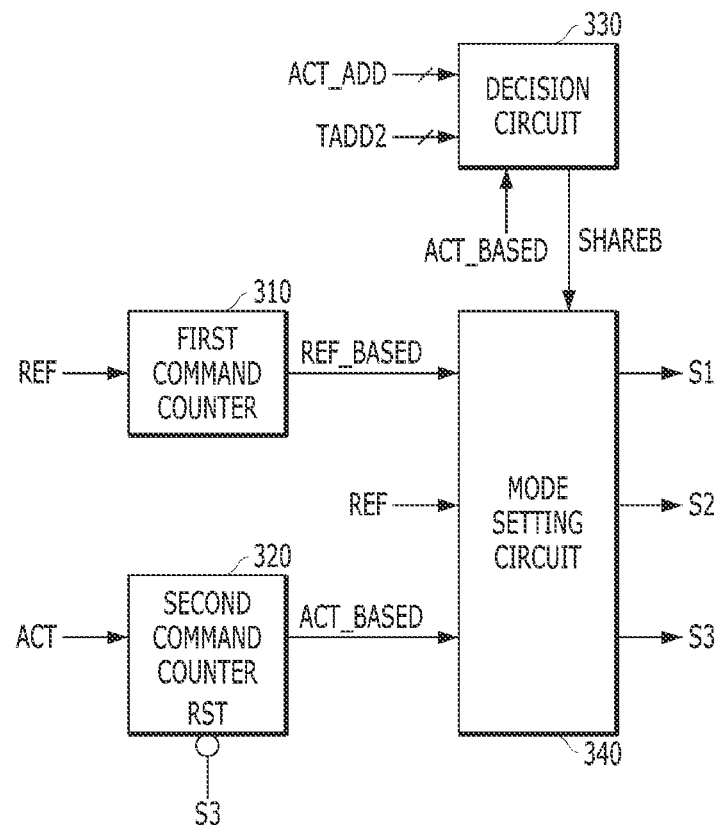
FIG. 3 is a detailed block diagram illustrating a mode control circuit, such as that of FIG. 1.
Figure 4:
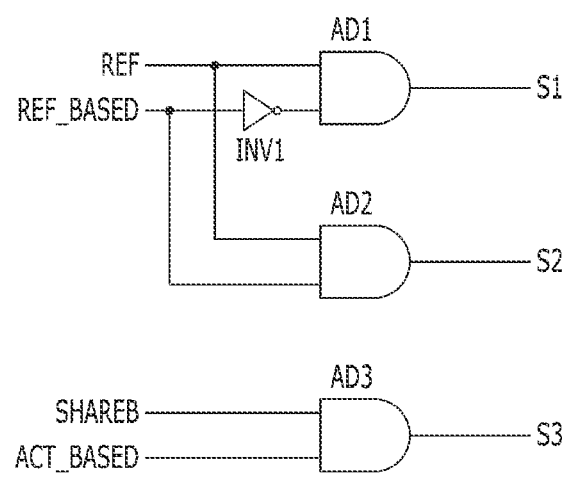
FIG. 4 is a detailed circuit diagram illustrating a mode setting circuit, such as that of FIG. 3.

FIG. 3 is a detailed block diagram illustrating the mode control circuit 1622 of FIG. 1. FIG. 4 is a detailed circuit diagram illustrating a mode setting circuit 340 of FIG. 3.

Referring to FIG. 3, the mode control circuit 1622 may include a first command counter 310, a second command counter 320, a decision circuit 330, and a mode setting circuit 340.

The first command counter 310 may count the number of inputs of the refresh commands REF, and enable a first target refresh mode signal REF_BASED when that number is equal to the first threshold. Preferably, the first command counter 310 may be reset when the number of inputs of the refresh commands REF reaches the first threshold.

The second command counter 320 may count the number of inputs of the active commands ACT, and enable a second target refresh mode signal ACT_BASED when that number is greater than or equal to the second threshold. The second command counter 320 may be reset according to the third selection signal S3. In particular, the second command counter 320 may be reset in response to a falling edge of the third selection signal S3.

The decision circuit 330 may compare the active address ACT_ADD with the second target address TADD2 when the second target refresh mode signal ACT_BASED is enabled. The decision circuit 330 may compare some bits of the active address ACT_ADD with some bits of the second target address TADD2. For reference, some bits of the active address ACT_ADD and the second target address TADD2 may correspond to a block address allocated to designate a memory block. By comparing the block address of the active address ACT_ADD and the block address of the second target address TADD2, the decision circuit 330 may determine whether or not the memory blocks corresponding to the active address ACT_ADD and the second target address TADD2 respectively share the sense amplifying circuit. The decision circuit 330 may disable and output a determination signal SHAREB to a logic low level when the memory blocks designated by the block addresses share the sense amplifying circuit. The decision circuit 330 may enable and output the determination signal SHAREB to a logic high level when the memory blocks designated by the block addresses do not share the sense amplifying circuit.

The mode setting circuit 340 may generate the first to third selection signals S1 to S3 according to the refresh command REF, the first target refresh mode signal REF_BASED, the second target refresh mode signal ACT_BASED, and the determination signal SHAREB. The mode setting circuit 340 may enable the first selection signal S1 when the refresh command REF is inputted in a state that the first target refresh mode signal REF_BASED is disabled. The mode setting circuit 340 may enable the second selection signal S2 when the refresh command REF is inputted in a state that the first target refresh mode signal REF_BASED is enabled. The mode setting circuit 340 may enable the second selection signal S3 when the determination signal SHAREB is enabled to a logic high level in a state that the second target refresh mode signal ACT_BASED is enabled.

For example, referring to FIG. 4, the mode setting circuit 340 may include first to third AND gates AD1 to AD3, and a first inverter INV1. The first inverter INV1 may invert the first target refresh mode signal REF_BASED. The first AND gate AD1 may perform a logic AND operation on the refresh command REF and an output of the first inverter INV1 to output the first selection signal S1. The second AND gate AD2 may perform a logic AND operation on the refresh command REF and the first target refresh mode signal REF_BASED to output the second selection signal S2. The third AND gate AD3 may perform a logic AND operation on the determination signal SHAREB and the second target refresh mode signal ACT_BASED to output the third selection signal S3.

Hereinafter, referring to FIGS. 1 to 6, an operation of a semiconductor memory device in accordance with an embodiment of the present invention is explained.

Figure 5:
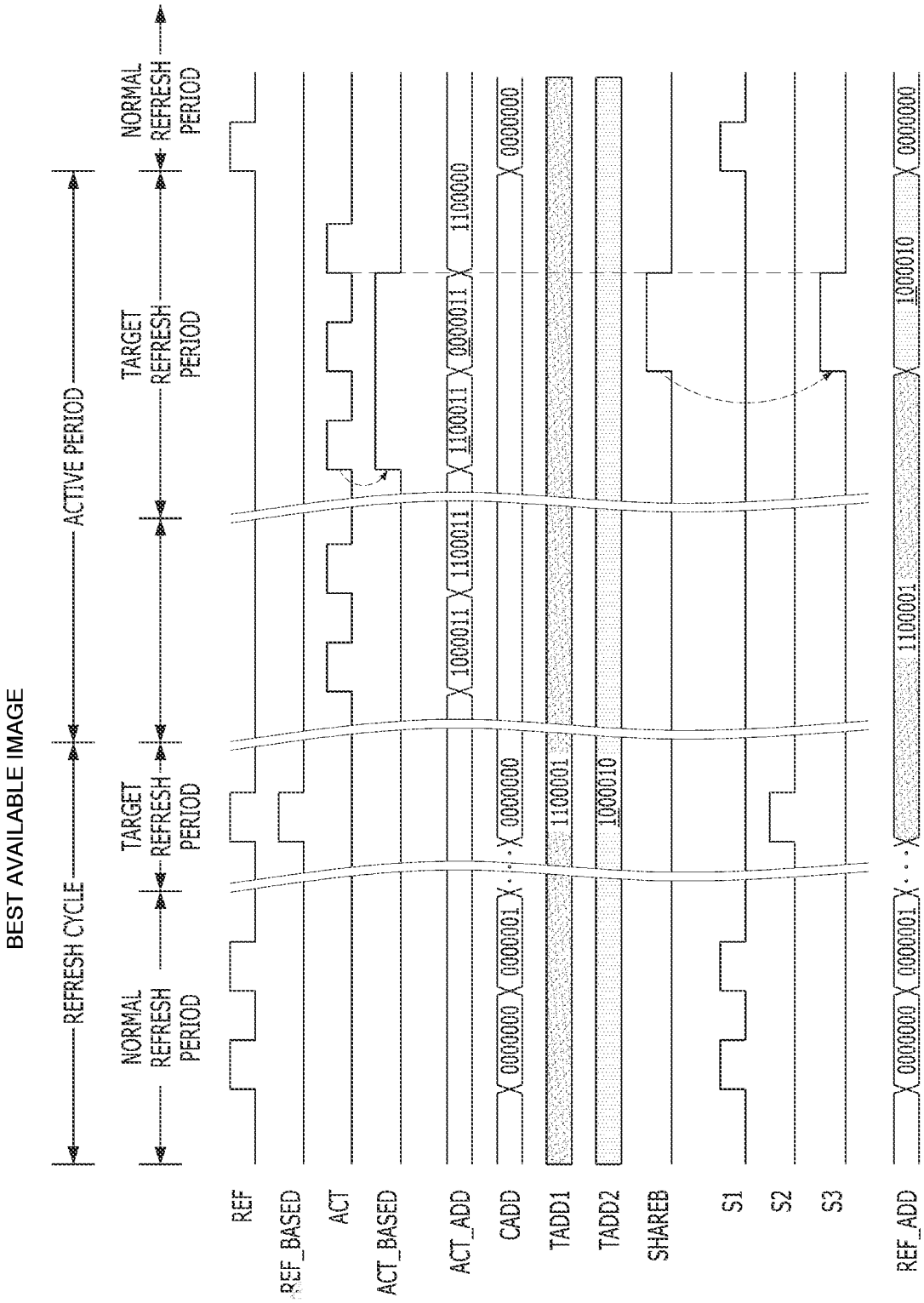
FIG. 5 is a waveform diagram for describing an operation of a semiconductor memory device in accordance with an embodiment of the present invention.
Figure 6:
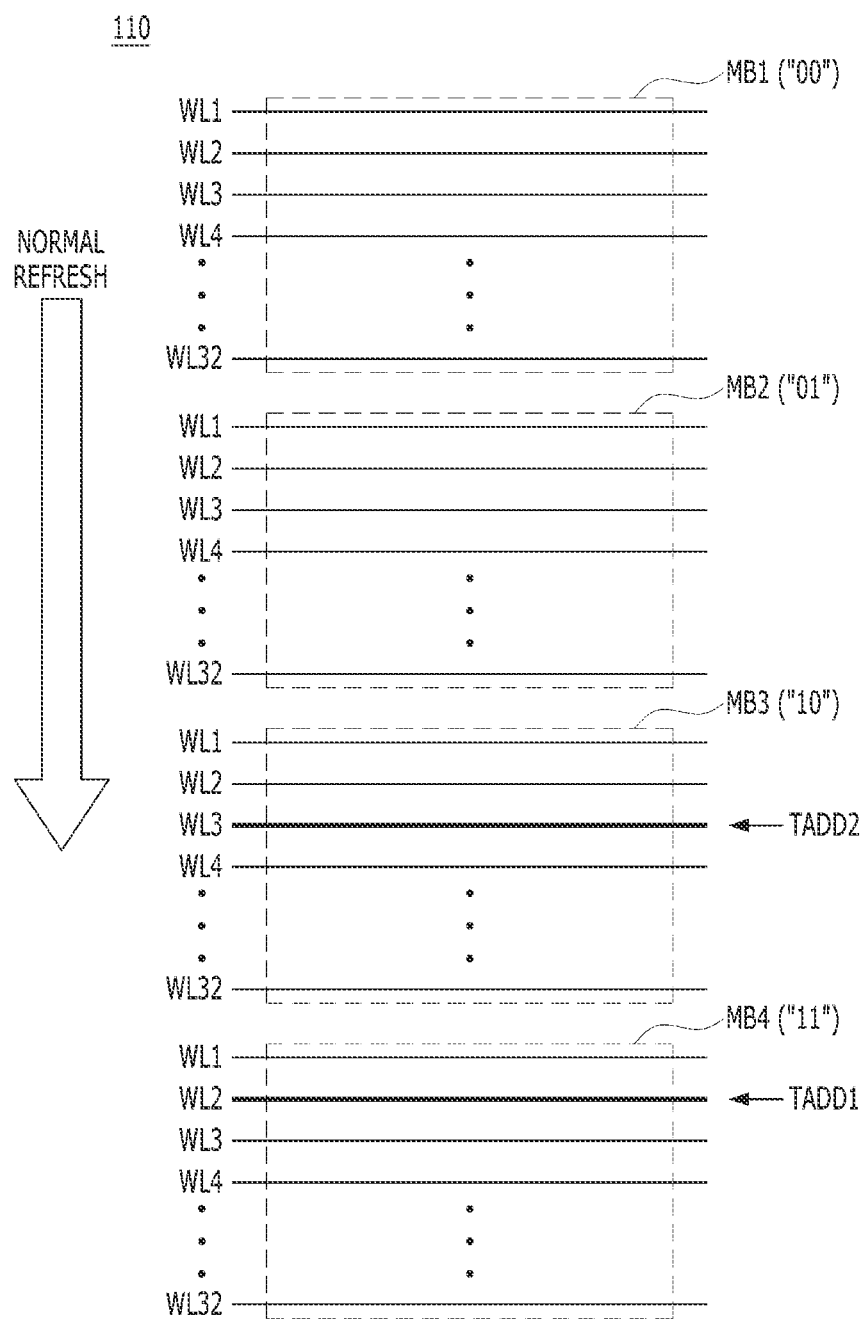
FIG. 6 is a diagram to help understand FIG. 5.

FIG. 5 is a waveform diagram for describing an operation of a semiconductor memory device in accordance with an embodiment of the present invention. FIG. 6 is a diagram to help understand FIG. 5.

Referring to FIG. 6, it is assumed that first to fourth memory blocks MB1 to MB4 are disposed in a bank, first to 32th word lines WL1 to WL32 are disposed in each of the first to fourth memory blocks MB1 to MB4, and thus total 128 word lines are disposed in the cell array region 110. Addresses ACT_ADD, CADD, TADD1, TADD2, and REF_ADD may be configured by 2-bit MSB for designating the first to fourth memory blocks MB1 to MB4, and 5-bit LSB for designating the first to 32th word lines WL1 to WL32 in each memory block. That is, 2-bit MSB "00", "01", "10", "11" of the addresses ACT_ADD, CADD, TADD1, TADD2, and REF_ADD may be allocated to sequentially designate the first to fourth memory blocks MB1 to MB4. Further, it is assumed that the first sampling latch 142 samples and stores the first target address TADD1 "1100001", and the second sampling latch 144 samples and stores the second target address TADD2 "1000010". The first target address TADD1 "1100001" may designate the second word line WL2 disposed in the fourth memory block MB4, and the second target address TADD2 "1000010" may designate the third word line WL3 disposed in the third memory block MB3.

Referring to FIG. 5, the command decoder 176 decodes the command CMD inputted through the command input circuit 172, and generates the refresh command REF. The refresh counter 120 counts the number of inputs of the refresh command REF, to generate the counting address CADD having a value sequentially increasing from "0000000" to "1111111" in increments of +1. The first command counter 310 disables the first target refresh mode signal REF_BASED since the number refresh commands REF input is less than the first threshold (e.g., 129). The mode setting circuit 340 enables the first selection signal S1 when the refresh command REF is inputted in a state that the first target refresh mode signal REF_BASED is disabled. The selection circuit 1624 outputs the refresh address REF_ADD by selecting the counting address CADD when the first selection signal S1 is enabled. The row control circuit 164 may perform a normal refresh operation by activating and refreshing a word line corresponding to the refresh address REF_ADD whenever the refresh command REF is inputted. During the normal refresh operation, 128 word lines from the first word line WL1 of the first memory block MB1 to the 32th word line WL32 of the fourth memory block MB4 may be sequentially refreshed.

Thereafter, when the first command counter 310 enables the first target refresh mode signal REF_BASED when the number of inputs of the refresh commands REF is equal to the first threshold (i.e., 129). The first command counter 310 may be reset when the number of inputs of the refresh commands REF reaches the first threshold. The mode setting circuit 340 enables the second selection signal S2, and the selection circuit 1624 outputs the refresh address REF_ADD by selecting the first target address TADD1 "1100001". The row control circuit 164 may perform a target refresh operation by activating and refreshing the second word line WL2 disposed in the fourth memory block MB4 corresponding to the refresh address REF_ADD "1100001". As a result, the target refresh operation may be performed on the refresh command basis during a refresh cycle.

After finishing the refresh cycle, the command decoder 176 decodes the command CMD inputted through the command input circuit 172, and generates the active command ACT. The row control circuit 164 may perform a normal operation such as a read or wrote operation by activating a word line corresponding to the input address IADD in response to activation of the active command ACT.

The second command counter 320 counts the number of inputs of the active commands ACT, and enables the second target refresh mode signal ACT_BASED when the number of inputs of the active commands ACT is greater than or equal to the second threshold. The decision circuit 330 compares the active address ACT_ADD with the second target address TADD2 when the second target refresh mode signal ACT_BASED is enabled. The decision circuit 330 compares the block address of the active address ACT_ADD with the block address of the second target address TADD2. For example, the decision circuit 330 compares the active address ACT_ADD "1100011" with the second target address TADD2 "1000010". The block address of the active address ACT_ADD "1100011" designates the fourth memory block MB4 that shares the sense amplify circuit with the third memory block MB3 designated by the second target address TADD2 "1000010". Thus, the decision circuit 330 disables the determination signal SHAREB to a logic low level. For example, the decision circuit 330 compares the active address ACT_ADD "0000011" with the second target address TADD2 "1000010". The block address of the active address ACT_ADD "0000011" designates the first memory block MB1 that does not share the sense amplify circuit with the third memory block MB3 designated by the second target address TADD2 "1000010". Thus, the decision circuit 330 enables the determination signal SHAREB to a logic high level.

The mode setting circuit 340 enables the second selection signal S3 when the determination signal SHAREB is enabled to a logic high level in a state that the second target refresh mode signal ACT_BASED is enabled. The selection circuit 1624 outputs the refresh address REF_ADD by selecting the second target address TADD2 "1000010". When the third selection signal S3 is enabled, the row control circuit 164 activates the fourth word line WL4 disposed in the first memory block MB1 word line corresponding to the input address IADD (i.e., the active address ACT_ADD "0000011"), and at a certain interval thereafter, activates the third word line WL3 disposed in the third memory block MB3, in response to the active command ACT. The second command counter 320 may reset the second target refresh mode signal ACT_BASED in response to a falling edge of the third selection signal S3. As a result, the target refresh operation may be performed on the active command basis during a refresh cycle.

Thereafter, the row control circuit 164 precharges the activated word lines in response to the precharge command PCG.

Consequently, the semiconductor memory device 100 may perform the additional target refresh operation while performing the normal operation.

As described above, the semiconductor memory device 100 may perform the additional target refresh operation while performing the normal operation such as a read or write operation. Thus, it is possible to improve the efficiency of the target refresh operation by performing the target refresh operation on the active command basis as well as performing the target refresh operation on the refresh command basis.

While the present invention has been illustrated and described with respect to various embodiments, it will be apparent to those skilled in the art that various changes and modifications may be made without departing from the spirit and scope of the invention as defined in the following claims. For example, the logic gates and transistors illustrated in the above embodiments may be different types than disclosed and arranged differently than disclosed according to the polarity of an input signal. The present invention encompasses all variations that fall within the scope of the claims.

What is claimed is:

1. A semiconductor memory device comprising:
a plurality of memory blocks including a plurality of word lines;
a plurality of sense amplifying circuits, each being shared by adjacent memory blocks among the memory blocks;
a refresh counter configured to generate a counting address, a value of which increases according to a refresh command;
an address storing circuit configured to store first and second target addresses by sampling an active address at different times; and
a control circuit configured to activate a word line corresponding to one of the counting address and the first target address according to the refresh command, and activate at least one word line corresponding to one or more of the active address and the second target address according to an active command based on a result of comparing the active address with the second target address.

2. The semiconductor memory device of claim 1,
wherein the control circuit activates the word line corresponding to the counting address when the number of inputs of the refresh commands is less than a first threshold, and
wherein the control circuit activates the word line corresponding to the first target address when the number of inputs of the refresh commands reaches the first threshold.

3. The semiconductor memory device of claim 1, wherein the control circuit activates the at least one word line corresponding to one or more of the active address and the second target address by determining whether or not memory blocks respectively corresponding to the active address and the second target address share one of the sense amplifying circuits when the number of inputs of the active commands is greater than or equal to a second threshold.

4. The semiconductor memory device of claim 1, wherein the control circuit includes:
a refresh control circuit configured to select the counting address or the first target address according to whether the number of inputs of the refresh commands reaches a first threshold and select the second target address according to a result of comparing the active address with the second target address when the number of inputs of the active commands is greater than or equal to a second threshold, the refresh control circuit providing the selected address as a refresh address; and
a row control circuit configured to activate a word line corresponding to the active address in response to the active command, and activate a word line corresponding to the refresh address in response to the refresh command.

5. The semiconductor memory device of claim 4, wherein the refresh control circuit selects the second target address when memory blocks respectively corresponding to the active address and the second target address do not share any of the sense amplifying circuits.

6. The semiconductor memory device of claim 4, wherein the row control circuit activates the word line corresponding to the refresh address at a certain interval after activating the word line corresponding to the active address, in response to the active command, when memory blocks respectively corresponding to the active address and the second target address do not share with each other any among the sense amplifying circuits.

7. The semiconductor memory device of claim 4, wherein the refresh control circuit includes:
a mode control circuit configured to enable a first selection signal when the number of inputs of the refresh commands is less than the first threshold, enable a second selection signal when the number of inputs of the refresh commands reaches the first threshold, and enable a third selection signal according to the comparison result when the number of inputs of the active commands is greater than or equal to the second threshold; and
a selection circuit configured to output the refresh address.

8. The semiconductor memory device of claim 7, wherein the mode control circuit includes:

a first command counter configured to enable a first target refresh mode signal when the number of inputs of the refresh commands is equal to the first threshold;
a second command counter configured to enable a second target refresh mode signal when the number of inputs of the active commands is greater than or equal to the second threshold;
a decision circuit configured to generate a determination signal by comparing the active address with the second target address according to the second target refresh mode signal; and
a mode setting circuit configured to generate the first to third selection signals according to the refresh command, the first and second target refresh mode signals, and the determination signal.

9. The semiconductor memory device of claim 1, wherein the address storing circuit includes:
a first sampling latch configured to store the active address as the first target address according to a first sampling signal; and
a second sampling latch configured to store the active address as the second target address according to a second sampling signal.

10. The semiconductor memory device of claim 1, further comprising: an active latch configured to store an input address inputted together with the active command, as the active address.

11. A semiconductor memory device comprising:
a cell array region in which a plurality of word lines are disposed;
a first sampling latch configured to store an active address as a first target address according to a first sampling signal;
a second sampling latch configured to store the active address as a second target address according to a second sampling signal;
a refresh control circuit configured to select the first target address when the number of inputs of refresh commands reaches a first threshold and select the second target address according to a result of comparing the active address with the second target address when the number of inputs of active commands is greater than or equal to a second threshold, the refresh control circuit providing the selected address as a refresh address; and
a row control circuit configured to activate a word line corresponding to the active address in response to the active command, and activate a word line corresponding to the refresh address in response to the refresh command or the active command.

12. The semiconductor memory device of claim 11, wherein the cell array region includes:
a plurality of memory blocks including a plurality of memory cells disposed at intersections of the word lines and bit lines; and
a plurality of sense amplifying circuits, each being shared by adjacent memory blocks among the memory blocks.

13. The semiconductor memory device of claim 12, wherein the refresh control circuit selects the second target address when memory blocks respectively corresponding to the active address and the second target address do not share any of the sense amplifying circuits.

14. The semiconductor memory device of claim 12, wherein the row control circuit activate the word line corresponding to the refresh address at a certain interval after activating the word line corresponding to the active address, in response to the active command, when memory blocks respectively corresponding to the active address and the second target address do not share any of the sense amplifying circuits.

15. The semiconductor memory device of claim 11, further comprising: a refresh counter configured to generate a counting address having a value increasing according to the refresh command,
wherein the refresh control circuit is further configured to select the counting address when the number of inputs of the refresh commands is less than the first threshold.

16. The semiconductor memory device of claim 11, further comprising: an active latch configured to store an input address inputted together with the active command, as the active address.

17. The semiconductor memory device of claim 11, wherein the refresh control circuit includes:
a mode control circuit configured to enable a first selection signal when the number of inputs of the refresh commands is less than the first threshold, enable a second selection signal when the number of inputs of the refresh commands reaches the first threshold, and enable a third selection signal according to the comparison result when the number of inputs of the active commands is greater than or equal to the second threshold; and
a selection circuit configured to output the refresh address.

18. The semiconductor memory device of claim 17, wherein the mode control circuit includes:
a first command counter configured to enable a first target refresh mode signal when the number of inputs of the refresh commands is equal to the first threshold;
a second command counter configured to enable a second target refresh mode signal when the number of inputs of the active commands is greater than or equal to the second threshold;
a decision circuit configured to generate a determination signal by comparing the active address with the second target address according to the second target refresh mode signal; and
a mode setting circuit configured to generate the first to third selection signals according to the refresh command, the first and second target refresh mode signals, and the determination signal.

19. The semiconductor memory device of claim 11, further comprising: a sampling enable circuit configured to enable the first and second sampling signals at different times.

20. An operating method of a semiconductor memory device including a plurality of memory blocks including a plurality of word lines, and a plurality of sense amplifying circuits, each being shared by adjacent memory blocks among the memory blocks, the operating method comprising:
storing an active address as a first target address according to a first sampling signal;
storing the active address as a second target address according to a second sampling signal;
selecting the first target address when the number of inputs of refresh commands reaches a first threshold and selecting the second target address according to a result of comparing the active address with the second target address when the number of inputs of active commands is greater than or equal to a second threshold, and providing the selected address as a refresh address; and
activating a word line corresponding to the active address in response to the active command, and activating a word line corresponding to the refresh address in response to the refresh command.

21. The operating method of claim 20, wherein the second target address is selected when memory blocks respectively corresponding to the active address and the second target address do not share any of the sense amplifying circuits.

22. The operating method of claim 20, wherein the activating a word line includes: activating the word line corresponding to the refresh address at a certain interval after activating the word line corresponding to the active address, in response to the active command, when memory blocks respectively corresponding to the active address and the second target address do not share any of the sense amplifying circuits.

23. The operating method of claim 20,
further comprising: generating a counting address, a value of which increases according to the refresh command,
wherein the selecting includes selecting the counting address when the number of inputs of the refresh commands is less than the first threshold.

24. The operating method of claim 20, wherein the first sampling signal is enabled at different times from the second sampling signal.

25. A semiconductor memory device comprising:
first and second memory blocks sharing a sense amplifying circuit;
an address storing circuit configured to store, as a target address, a sampled address indicating a word line within the first memory block, among provided active addresses; and
a control circuit configured to activate, when the number of inputs of active commands reaches a threshold, the word line depending on whether a currently provided active address indicates the second memory block.

* * * * *